(12) United States Patent
Hill et al.

(10) Patent No.: US 7,153,780 B2
(45) Date of Patent: Dec. 26, 2006

(54) METHOD AND APPARATUS FOR SELF-ALIGNED MOS PATTERNING

(75) Inventors: Ervin T. Hill, Los Lunas, NM (US);
Oleh P. Karpenko, San Jose, CA (US);
Gordon T. McGarvey, Sunnyvale, CA (US); Linda N. Marquez, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 10/808,793

(22) Filed: Mar. 24, 2004

(65) Prior Publication Data

US 2005/0215039 A1    Sep. 29, 2005

(51) Int. Cl.
*H01L 21/302* (2006.01)

(52) U.S. Cl. .................. 438/717; 438/736; 438/706; 257/E21.192

(58) Field of Classification Search ............... 438/257, 438/258, 241, 275, 689, 286, 717, 736, 706
See application file for complete search history.

(56) References Cited

U.S. PATENT DOCUMENTS

| | | | |
|---|---|---|---|
| 4,142,926 A | | 3/1979 | Morgan |
| 6,461,984 B1 * | | 10/2002 | Han et al. .................. 438/788 |
| 6,509,237 B1 * | | 1/2003 | Wang et al. ................ 438/286 |
| 6,518,151 B1 * | | 2/2003 | Dobuzinsky et al. ....... 438/551 |
| 6,780,708 B1 * | | 8/2004 | Kinoshita et al. ........... 438/241 |
| 6,835,662 B1 * | | 12/2004 | Erhardt et al. .............. 438/689 |
| 6,869,542 B1 * | | 3/2005 | Desphande et al. ........... 216/51 |
| 6,869,899 B1 * | | 3/2005 | Mahorowala et al. ....... 438/587 |
| 6,893,938 B1 * | | 5/2005 | Naeem et al. .............. 438/424 |
| 2003/0017711 A1 * | | 1/2003 | Mahorowala et al. ....... 438/719 |
| 2004/0110387 A1 * | | 6/2004 | Chowdhury ................ 438/710 |
| 2004/0178169 A1 * | | 9/2004 | Desphande et al. ........... 216/12 |
| 2004/0209476 A1 * | | 10/2004 | Ying et al. .................. 438/706 |
| 2005/0079706 A1 * | | 4/2005 | Kumar et al. ............... 438/638 |
| 2005/0085090 A1 * | | 4/2005 | Mui et al. .................. 438/714 |
| 2005/0098821 A1 * | | 5/2005 | Chao et al. ................. 257/314 |
| 2005/0199585 A1 * | | 9/2005 | Wang et al. .................. 216/67 |
| 2005/0208434 A1 * | | 9/2005 | Mosden et al. ............. 430/323 |

OTHER PUBLICATIONS

"Applied Advanced Patterning Film" Applied Materials, www.appliedmaterials.com/products/producer_apt. html.

* cited by examiner

*Primary Examiner*—Asok K. Sarkar
*Assistant Examiner*—Victor V. Yevsikov
(74) *Attorney, Agent, or Firm*—Blakely, Sokoloff, Taylor & Zafman LLP

(57) ABSTRACT

A method of forming a thin film stack on a substrate, wherein the thin film stack includes at least a polysilicon layer and an oxide layer; forming a hardmask layer on the thin film stack; forming an anti-reflective coating (ARC) layer on the hardmask layer; patterning the ARC layer; etching the hardmask layer using the patterned ARC layer as a mask; and etching the thin film stack using the hardmask layer as a mask.

27 Claims, 6 Drawing Sheets

METHOD AND APPARATUS FOR SELF-ALIGNED MOS PATTERNING

BACKGROUND OF THE INVENTION

1. Field of the Invention

The present invention relates to the field of semiconductor device fabrication, and in particular to lithography patterning of thin film stacks for lithography using light having a wavelength of 193 nm or less.

2. Discussion of Related Art

Present semiconductor fabrication techniques may be used to generate single electrode transistor gates using 193 nm wavelength lithography technology or dual electrode flash memory transistor gates using 248 nm wavelength lithography technology.

FIG. 1 illustrates a flash memory transistor gate stack. The flash memory gate stack is formed on substrate 100. The gate stack of the flash memory transistor consists of a control gate electrode layer 108 deposited over an inter-electrode dielectric 106, over a floating gate layer 104, over the gate dielectric 102, on a substrate 100. Source/drain spacer liner dielectric 140 is formed on either side of the flash memory gate stack. Source/drain spacer dielectric 142 is formed on either side of the gate stack on top of the source/drain spacer liner dielectric 140.

FIG. 2 illustrates the flash memory gate stack after the resist has been patterned using light 280 having a wavelength of 248 nm or greater. The thickness of the resist 214 is bounded by etch resistance and patterning resolution. The flash transistor gate is etched using a Self-Aligned MOS (SAMOS) process. The SAMOS process allows all layers of the flash transistor gate stack to be etched using the resist as a mask, including the gate dielectric 202, the floating gate electrode 204, the interelectrode dielectric 206, and the control gate electrode 208.

To achieve high resolution patterning with 193 nm (or less) lithography for flash transistors, a change in resist formulation is required. The resist formulation for 193 nm lithography compromises the ability of the resist to withstand the environment required to etch the SAMOS flash gate stack, and is not stable in etch chemistries. Thus, it is undesirable to use resist as a mask to etch the flash SAMOS gate stack using 193 nm or less lithography.

Hardmask materials that consist of similar elements to those found in the inter-poly dielectric layer, such as a nitride layer, are also undesirable for use as a SAMOS mask. These materials may be compromised during the etch process. Furthermore, the removal of a hardmask consisting of a similar material as the inter-poly dielectric layer may compromise the dielectric and lead to device failure.

DETAILED DESCRIPTION OF THE PRESENT INVENTION

In the following description, numerous specific details are set forth, such as exact process steps, in order to provide a through understanding of the present invention. It will be apparent, however, that these specific details need not be employed to practice the present invention. In other instances, well known components or methods have not been described in detail in order to avoid unnecessarily obscuring the present invention.

Figure 1:
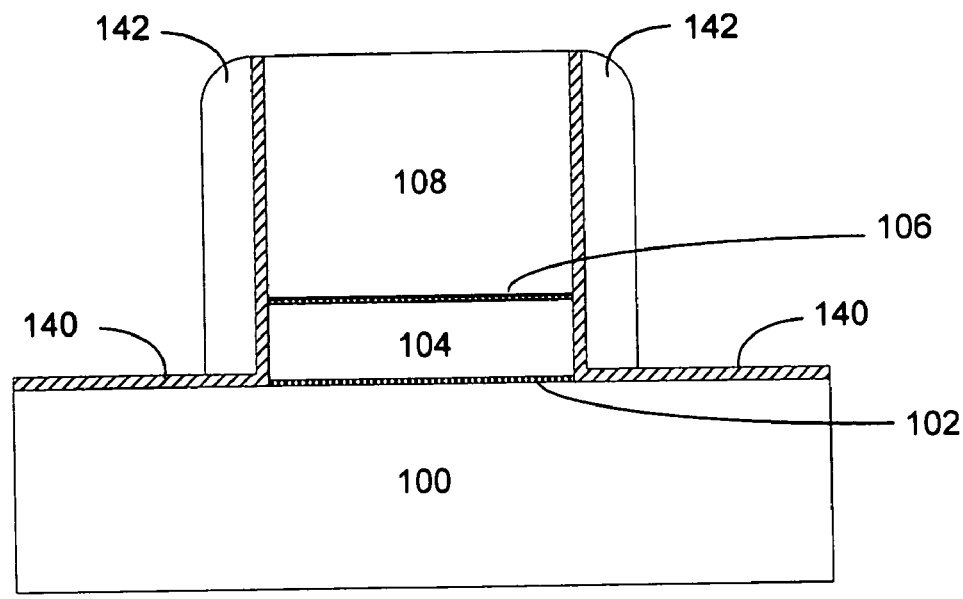
FIG. 1 is an illustration of a cross-sectional view of a flash memory transistor.
Figure 2:
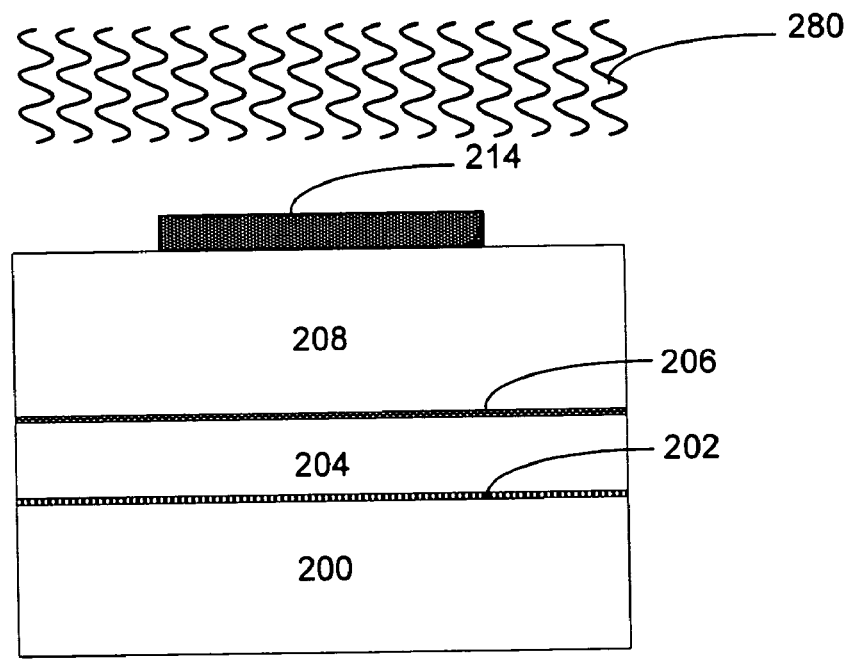
FIG. 2 is an illustration of a cross-sectional view of the flash memory transistor gate stack with patterned resist.
Figure 3:
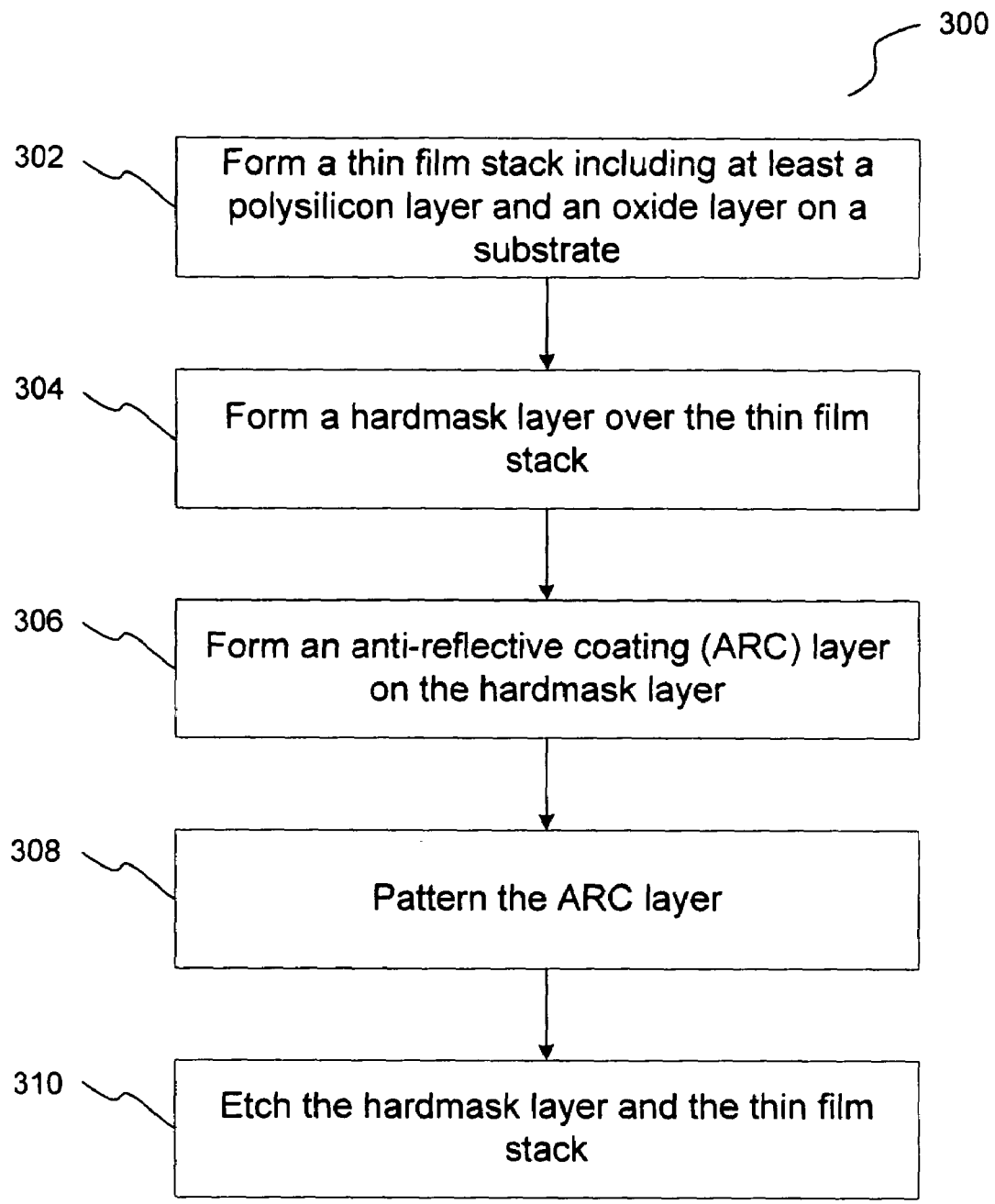
FIG. 3 is a flow diagram illustrating a process in accordance with one embodiment of the present invention.

FIG. 3 is a flow diagram 300 which illustrates a process in accordance with one embodiment of the present invention. Flow diagram 300 illustrates a general method of patterning and etching a thin film stack using a hardmask layer.

First, as shown in block 302, a thin film stack is formed. The thin film stack may include at least a poly silicon layer and an oxide layer on a substrate. In one embodiment, the thin film stack may be a flash memory gate stack. For simplicity, the thin film stack describe herein and illustrated in FIGS. 1, 2, and 4–10 is a flash memory gate stack, however, any thin film stack containing at least a polysilicon layer and an oxide layer may be substituted in other embodiments of the present invention.

Figure 4:
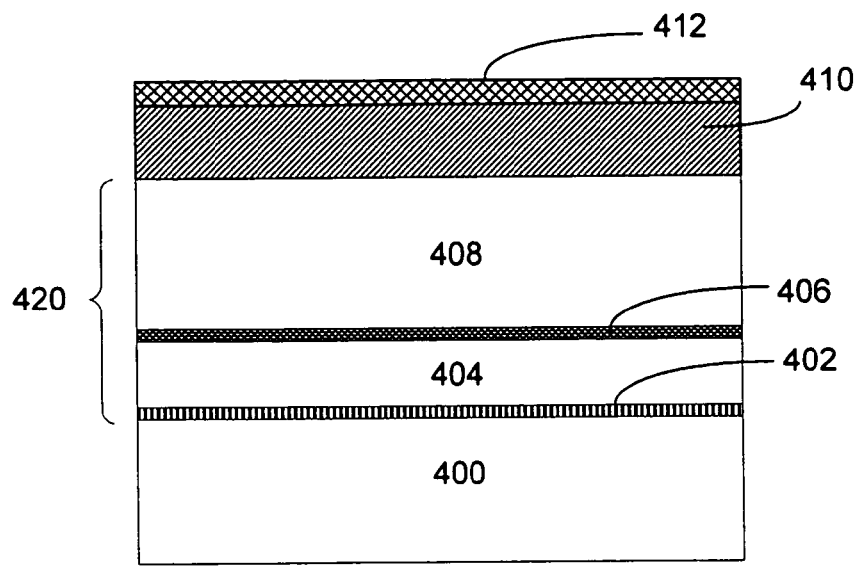
FIG. 4 is an illustration of a cross-sectional view of an initial thin film stack in accordance with one embodiment of the present invention.

FIG. 4 illustrates an exemplary flash memory gate stack 420. A gate dielectric layer 402 is grown or deposited on substrate 400. Substrate 400 may be a silicon substrate. The substrate may be comprised of a material other than silicon, including, but not limited to, materials such as gallium arsenide, or silicon on insulator (SOI) substrates. In one embodiment, the gate dielectric may comprise a silicon oxide or silicon oxynitride. After the gate oxide layer 402 is formed, the floating gate electrode layer 404 is deposited. The floating gate layer 404 may comprise an n-type polysilicon layer. Next, the interelectrode dielectric 406 is formed. The interelectrode dielectric 406 may comprise an ONO (oxide-nitride-oxide) layer. Finally, the control gate electrode layer 408 is formed. The control gate electrode 408 may comprise polysilicon.

Next, as illustrated in FIG. 3, block 304, a hardmask layer is formed over the thin film stack. The hardmask layer is illustrated in FIG. 4. FIG. 4 shows the hardmask layer 410 formed over the top surface of thin film stack 420, which in one embodiment may be a flash memory gate stack. The hardmask material must be resistant to both common polysilicon etch chemistries as well as oxide etch chemistries. The hardmask material must also have optical properties with a favorable extinction coefficient for 193 nm wavelength light. For future lithography nodes, the hardmask material must have optical properties that are favorable for light having wavelengths of less than 193 nm. In one embodiment, the hardmask layer may be a carbon-based layer, and may comprise a pure amorphous carbon layer. Applied Materials® Advanced Patterning Film™ (APF™) may be used for the hardmask. The hardmask layer may be formed to a thickness of 1000 to 3000 Å.

After the hardmask layer is formed, an anti-reflective coating (ARC) layer is formed over the hardmask layer, as illustrated in FIG. 3, block 306.

FIG. 4 illustrates the ARC layer 412 formed over the top surface of the hardmask layer. The ARC layer may be comprised of silicon dioxide, silicon oxynitride or a composite thereof. The ARC layer reduces undesirable light reflections by phase shift cancellation, which is dependent upon the extinction coefficient and the thickness of the film. The ARC material must have optical properties with a favorable extinction coefficient for 193 nm lithography. For future lithography nodes, the ARC material must have optical properties that are favorable for light having wavelengths of less than 193 nm. The ARC layer may be formed to a thickness of 100 to 500 Å.

Figure 5:
FIG. 5 is an illustration of a cross-sectional view of the thin film stack after the ARC has been patterned using lithography in accordance with one embodiment of the present invention.
Figure 5:
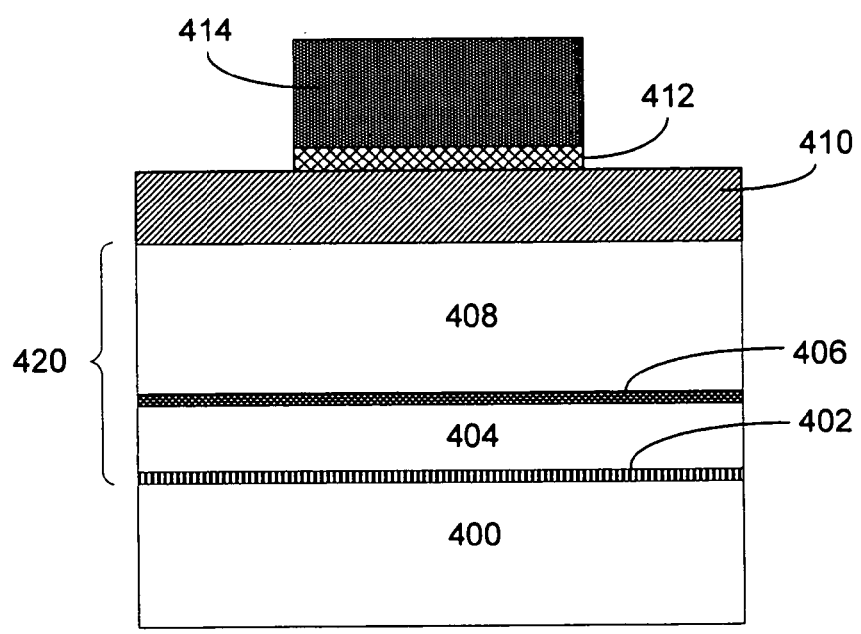

Using photoresist, the ARC layer is then patterned to define the flash gate, as illustrated in FIG. 3, block 308. The photoresist may be patterned using standard 193 nm wavelength light, 480, as shown in FIG. 5. Lithography using light having a wavelength of less than 193 nm may also be used.

FIG. 5 illustrates the thin film stack after the ARC layer 412 has been patterned with photoresist 414. The resist formulation must be appropriate for 193 nm lithography. Resist 414 may be formed to a thickness of 2000 to 5000 Å. The resist thickness may be optimized for patterning resolution only, and does not require etch resistance consideration. Standard etch chemistries may be used to define the pattern in the ARC. Since the etch chemistry used typically will have a high selectivity to photoresist, this is also the pattern transfer step for the lithography. Because both the resist 414 and the hardmask 410 may be comprised of carbon, the ARC layer 412 prevents the hardmask 410 from being breached during the etch process.

After the ARC layer has been patterned, the hardmask layer and the thin film stack may be etched, as set forth in FIG. 3, block 310.

Figure 6:
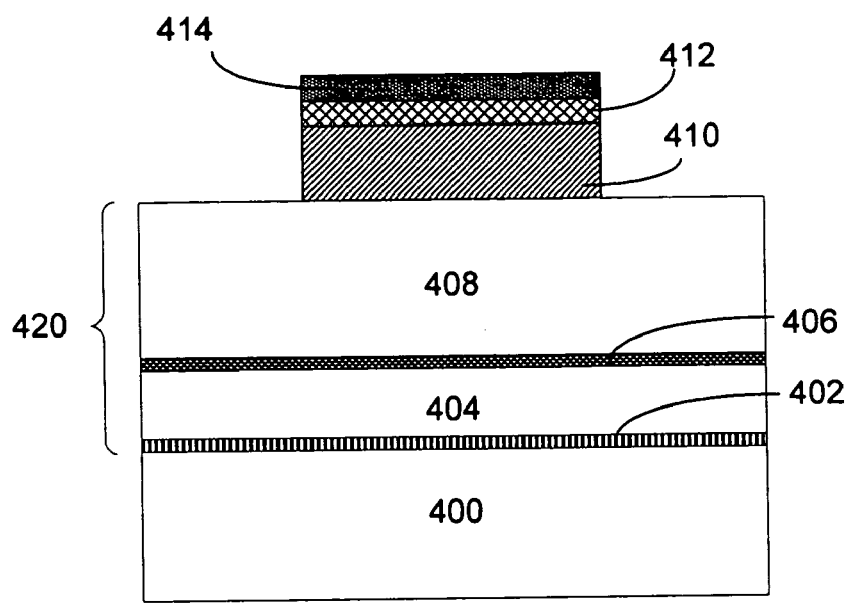
FIG. 6 is an illustration of a cross-sectional view of the thin film stack after the hardmask has been etched in accordance with one embodiment of the present invention.

FIG. 6 illustrates the hardmask etch. The patterned ARC layer 412 is used as a mask to etch the hardmask layer 410. A standard etch chemistry may be used to etch the hardmask. In one embodiment, the hardmask may be etched using an oxygen and argon etch chemistry. Much of the resist 414 may be removed by the hardmask etch process. This is because both the hardmask and the resist are composed of carbon based materials. An etch chemistry which etches the hardmask will also etch the resist.

After the pattern has been transferred from the ARC layer 412 to the hardmask layer 410, the hardmask layer may be used as a mask to etch the remainder of the thin film stack because the hardmask material is selective to both the polysilicon and oxide etch chemistries.

Figure 7:
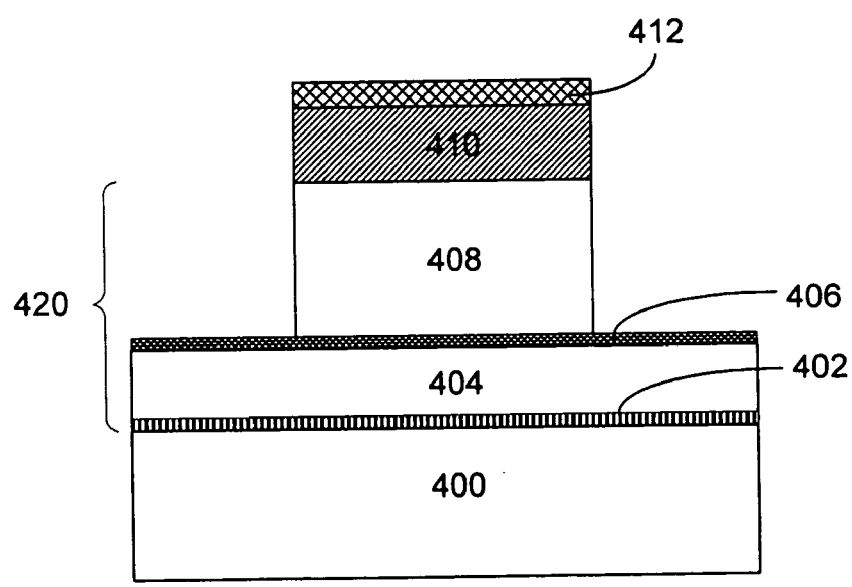
FIG. 7 is an illustration of a cross-sectional view of the thin film stack after the control gate has been etched in accordance with one embodiment of the present invention.

FIG. 7 illustrates the control gate etch. Hardmask 410 is used as a mask to pattern the control gate 408. The hardmask is selective to the polysilicon etch chemistry, and remains intact after the control gate is etched.

The ARC layer needs to remain intact only for the duration of the hardmask etch, since the hardmask has a high selectivity to both the polysilicon and oxide etch chemistries. The ARC layer 412 may be completely removed by the first polysilicon etch process.

Figure 8:
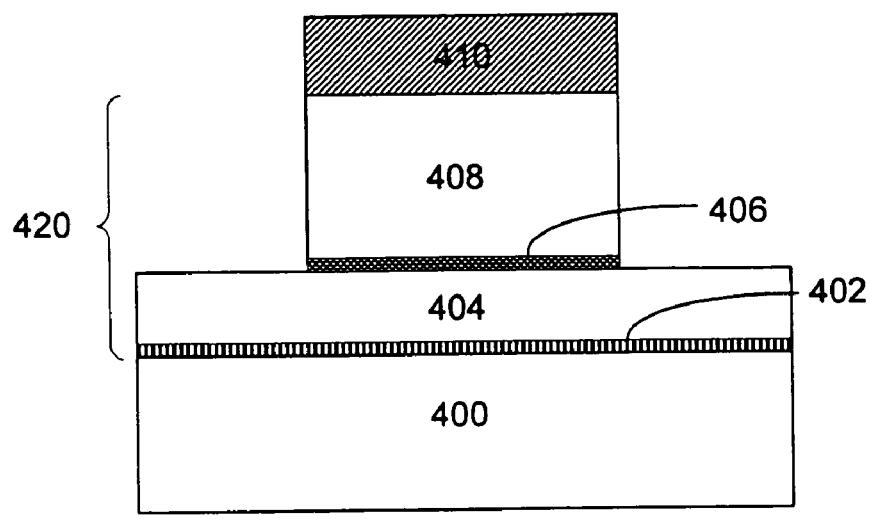
FIG. 8 is an illustration of a cross-sectional view of the thin film stack after the interelectrode dielectric has been etched in accordance with one embodiment of the present invention.

FIG. 8 illustrates the interelectrode dielectric etch. Hardmask 410 is used as a mask to pattern the interelectrode dielectric 406. The hardmask is selective to the dielectric etch chemistry, and remains intact after the interelectrode dielectric is etched. If any portion of the ARC layer remains on the top surface of the hardmask 410 after the first polysilicon etch process, it will be completely removed during the interelectrode dielectric etch. This is because the ARC layer and the interelectrode dielectric typically have similar physical properties and may be composed of similar materials.

Figure 9:
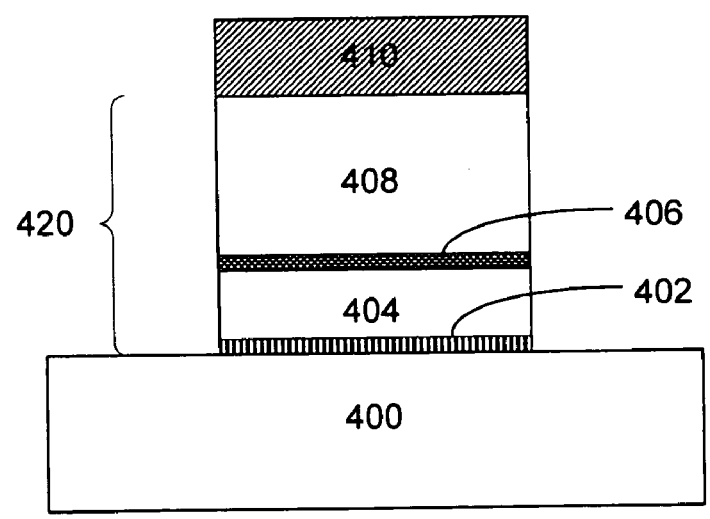
FIG. 9 is an illustration of a cross-sectional view of the thin film stack after the entire thin film stack has been etched in accordance with one embodiment of the present invention.

FIG. 9 illustrates the thin film stack after all layers have been etched, including the control gate 408, interelectrode dielectric 406, floating gate 404, and gate dielectric 402. The hardmask 410 is used as a mask for etching each of the layers. All layers may be etched during a single manufacturing step in the same chamber, however different etch chemistries may be required to etch different layers. The hardmask used to pattern each of the layers remains intact after the etch process is complete.

Figure 10:
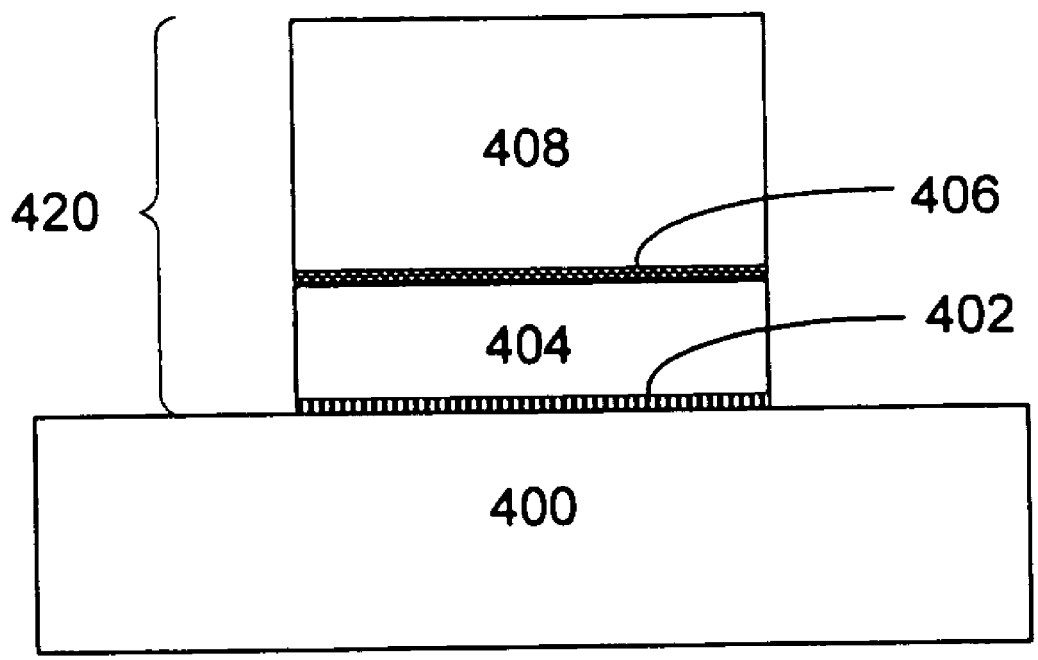
FIG. 10 is an illustration of a cross-sectional view of the thin film stack after the removal of the hardmask in accordance with one embodiment of the present invention.

After the thin film stack has been etched, the hardmask layer may be removed. A conventional cleaning process, such as a standard resist removal process, may be used to volatize the hardmask material and prepare the surface for further processing. In one embodiment, the hardmask may be removed using an oxygen plasma ash. FIG. 10 illustrates the thin film stack 420 after all layers have been etched and after the hardmask layer has been removed. The remaining etched thin film layers may comprise a flash memory gate stack, including control gate 408, interelectrode dielectric 406, floating gate 404, and gate dielectric 402.

The present invention may be implemented with various changes and substitutions to the illustrated embodiments. For example, the present invention may be implemented on various types of thin film stacks having different heights and comprising different materials. The present invention is not limited only to flash memory gate stacks. Furthermore, the present invention may be implemented on flash memory gates whose gate stacks vary from those described herein. For example, a flash memory gate stack may contain additional or different layers than those described herein.

Although specific embodiments, including specific parameters, methods, and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of this invention as expressed in the subjoined claims.

We claim:

1. A method comprising:
    forming a thin film stack on a substrate, wherein the thin film stack includes at least a polysilicon layer and an oxide layer;
    forming a hardmask layer on the thin film stack, wherein the hardmask layer is comprised of a carbon based material;
    forming an anti-reflective coating (ARC) layer on the hardmask layer; wherein the ARC layer comprises a different material than the hardmask layer;
    forming a resist layer on the ARC layer, wherein the resist layer is comprised of a carbon based material;
    patterning the resist layer and the ARC layer;

etching the hardmask layer using the patterned ARC layer as a mask, wherein a portion of he resist layer is removed during the etching of the hardmask layer; and etching the thin film stack using the hardmask layer as a mask.

2. The method of claim 1, wherein the resist layer is patterned using 193 nm or less lithography.

3. The method of claim 2, wherein the thickness of the resist layer is less than 5000 Å.

4. The method of claim 3, wherein the hardmask layer has a thickness of between 1000 and 3000 Å and the ARC layer has a thickness of between 100 and 500 Å.

5. The method of claim 3, wherein the hardmask layer comprises a material that has high selectivity to both polysilicon and oxide etch chemistries.

6. The method of claim 3, wherein the hardmask layer comprises amorphous carbon.

7. The method of claim 6, wherein the hardmask layer comprises Applied Materials® Advanced Patterning Film™ (APF™).

8. The method of claim 3, wherein the ARC layer is removed during the etching of the thin film stack.

9. The method of claim 3, further comprising removing the hardmask layer from the thin film stack.

10. A method comprising:
forming a flash memory gate stack on a substrate;
forming a hardmask layer on the flash memory gate stack wherein the hardmask layer is comprised of a carbon based material;
forming an anti-reflective coating (ARC) layer on the hardmask layer, wherein the ARC layer comprises a different material than the hardmask layer;
forming a resist layer on the ARC layer, wherein the resist layer is comprised of a carbon based material;
patterning the resist layer and the ARC layer;
etching the hardmask layer using the patterned ARC layer as a mask, wherein a portion of the resist layer is removed during the etching of the hardmask layer; and
etching the flash memory gate stack using the hardmask layer as a mask.

11. The method of claim 10, wherein the resist layer is patterned using 193 nm or less lithography.

12. The method of claim 11, wherein the thickness of the resist layer is less than 5000 Å.

13. The method of claim 12, wherein the flash memory gate stack is comprised of a gate dielectric layer, a floating gate layer, an inter-electrode dielectric layer, and a control gate electrode layer.

14. The method of claim 12, wherein the hardmask has a thickness of between 1000 and 3000 Å and the ARC layer has a thickness of between 100 and 500 Å.

15. The method of claim 12, wherein the hardmask layer comprises a material that has high selectivity to both polysilicon and oxide etch chemistries.

16. The method of claim 12, wherein the hardmask layer comprises amorphous carbon.

17. The method of claim 16, wherein the hardmask layer comprises Applied Materials® Advanced Patterning Film™ (APF™).

18. The method of claim 12, wherein the ARC layer is removed during the etching of the flash memory gate stack.

19. The method of claim 12, further comprising removing the hardmask layer from the flash memory gate stack.

20. A method comprising:
forming a first dielectric layer on a substrate;
forming a thin film stack above said first dielectric layer, wherein said thin film stack comprises a second dielectric layer between two polysilicon layers;
forming a hardmask layer on said thin film stack;
forming an anti-reflective coating (ARC) layer on said hardmask layer, wherein said ARC layer comprises a different material than said hardmask layer;
patterning said ARC layer to form a patterned ARC layer;
etching said hardmask layer using said patterned ARC layer as a mask; and
etching said thin film stack using said hardmask layer as a mask, wherein said patterned ARC layer is completely removed during the etching of said second dielectric layer between the two polysilicon layers of said thin film stack.

21. The method of claim 20, wherein said ARC layer is patterned with a resist layer using 193 nm or less lithography.

22. The method of claim 21, wherein the thickness of said resist layer is less than 5000 Å.

23. The method of claim 22, wherein said hardmask has a thickness of between 1000 and 3000 Å and said ARC layer has a thickness of between 100 and 500 Å.

24. The method of claim 22, wherein said hardmask layer comprises a material that has high selectivity to both polysilicon and dielectric etch chemistries.

25. The method of claim 22, wherein said hardmask layer comprises amorphous carbon.

26. The method of claim 25, wherein said hardmask layer comprises Applied Materials® Advanced Patterning Film™ (APF™).

27. The method of claim 22, further comprising removing said hardmask layer from said thin film stack.

* * * * *